United States Patent
Ma et al.

(10) Patent No.: US 10,522,602 B1
(45) Date of Patent: Dec. 31, 2019

(54) ORGANIC LIGHT-EMITTING DISPLAY PANEL AND DISPLAY DEVICE

(71) Applicant: WuHan TianMa Micro-Electronics Co., Ltd., Wuhan (CN)

(72) Inventors: Yangzhao Ma, Wuhan (CN); Tao Peng, Wuhan (CN); Yongzhi Wang, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 0 days.

(21) Appl. No.: 16/229,545

(22) Filed: Dec. 21, 2018

(30) Foreign Application Priority Data

Jun. 29, 2018 (CN) .......................... 2018 1 0701483

(51) Int. Cl.
*H01L 27/32* (2006.01)
*H01L 51/00* (2006.01)
*H01L 51/52* (2006.01)

(52) U.S. Cl.
CPC ........ *H01L 27/3246* (2013.01); *H01L 27/322* (2013.01); *H01L 51/0097* (2013.01); *H01L 51/5237* (2013.01); *H01L 51/5262* (2013.01); *H01L 2251/5338* (2013.01)

(58) Field of Classification Search
CPC .................. H01L 27/2348; H01L 51/5262
USPC ............................................. 257/40; 349/33
See application file for complete search history.

(56) References Cited

U.S. PATENT DOCUMENTS

| 2008/0150059 | A1* | 6/2008 | Yun | H01L 27/14621 |
| | | | | 257/432 |
| 2012/0168796 | A1* | 7/2012 | Moon | H01L 27/322 |
| | | | | 257/98 |
| 2014/0159022 | A1* | 6/2014 | Song | H01L 27/3248 |
| | | | | 257/40 |
| 2014/0285914 | A1* | 9/2014 | Sakano | G02B 5/20 |
| | | | | 359/892 |
| 2015/0041813 | A1* | 2/2015 | Kim | H01L 27/124 |
| | | | | 257/59 |
| 2015/0048333 | A1* | 2/2015 | Choi | H01L 51/5275 |
| | | | | 257/40 |
| 2016/0293672 | A1* | 10/2016 | Yun | H01L 27/322 |
| 2018/0197922 | A1* | 7/2018 | Song | H01L 51/5281 |

FOREIGN PATENT DOCUMENTS

CN         104885142 A        9/2015

\* cited by examiner

*Primary Examiner* — Steven H Loke
*Assistant Examiner* — Brandon C Fox
(74) *Attorney, Agent, or Firm* — Tarolli, Sundheim, Covell & Tummino LLP

(57) ABSTRACT

Provided are an organic light-emitting display panel and a display device. The organic light-emitting display panel includes: a display area; an organic light-emitting component located in the display area; a pixel defining layer located in the display area and including an aperture region defining the organic light-emitting component; a color resist layer located at a light-emitting side of the organic light-emitting component. The color resist layer includes a color resist corresponding to the aperture region, and a black resist located outside of the color resist in the display area. The color resist has a same color as the color of the organic light-emitting component corresponding to the corresponding aperture region.

9 Claims, 4 Drawing Sheets

ORGANIC LIGHT-EMITTING DISPLAY PANEL AND DISPLAY DEVICE

CROSS-REFERENCE TO RELATED APPLICATIONS

The present disclosure claims priority to Chinese Patent Application No. 201810701483.6, filed on Jun. 29, 2018, the content of which is incorporated herein by reference in its entirety.

TECHNICAL FIELD

The present disclosure relates to the field of display technologies, and particularly, relates to an organic light-emitting display panel and a display device.

BACKGROUND

At present, display technologies have been applied to various aspects of 'one's daily life, and accordingly, more and more materials and technologies have been used for display screens. Nowadays, the dominated display screens mainly include liquid crystal display screen and organic light-emitting display panel. Due to the self-luminous performance of the organic light-emitting display panel, the most energy-consuming backlight module of the organic light-emitting display panel is omitted when compared with the liquid crystal display, so that the organic light-emitting display panel has the advantage of energy efficiency. In addition, the organic light-emitting display panel is flexible and bendable. The organic light-emitting display panel will have excellent bendability by using a flexible substrate on which a plurality of conductive layers is sequentially formed. The plurality of conductive layers includes a thin film transistor driving array layer, an anode layer, an organic light-emitting layer, a cathode layer, and a thin film encapsulation layer.

With the increasing requirements on the bendability and foldability of the display products, the requirements on the stability and the number of bending of the flexible display product are also becoming higher. The present organic light-emitting display panel includes a plurality of sub-pixels, each of which has a corresponding opening region. The organic light-emitting component emits light in the aperture region. In order to reduce reflection of the ambient light in the non-aperture region, the organic light-emitting display panel further includes a polarizer. However, the polarizer is prone to breakage when being bent.

SUMMARY

The present disclosure provides an organic light-emitting display panel and a display device, which can reduce the reflection of ambient lights in a non-aperture region without a polarizer, thereby improving a bending resistance of the display panel.

In a first aspect of the present disclosure, an organic light-emitting display panel is provided. The organic light-emitting display panel includes a display area, and a plurality of organic light-emitting components located in the display area, a pixel defining layer located in the display area. The pixel defining layer includes a plurality of aperture regions, each of the plurality of aperture regions corresponds to s one of the plurality of organic light-emitting components. The organic light-emitting display panel further includes a color resist layer located at a light-emitting side of the plurality of organic light-emitting components. The color resist layer includes a plurality of color resists corresponding to the plurality of aperture regions and a plurality of black resists located outside the plurality of color resists in the display area. One of the plurality of color resists has a same color as one of the plurality of organic light-emitting components corresponding to a corresponding one of the plurality of aperture regions.

In a second aspect of the present disclosure, a display device including the above display panel is provided.

BRIEF DESCRIPTION OF DRAWINGS

In order to more clearly explain the embodiments of the present disclosure or the technical solution in the related art, the drawings to be used in the description of the embodiments or the related art will be briefly described below. Obviously, the drawings in the following description are some embodiments of the present disclosure. Those skilled in the art can obtain other drawings based on these drawings without paying any creative labor.

DESCRIPTION OF EMBODIMENTS

In order to more clearly illustrate objects, technical solutions and advantages of embodiments of the present disclosure, the technical solutions in the embodiments of the present disclosure are clearly and completely described below with reference to the accompanying drawings in the embodiments of the present disclosure. Obviously, the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

Figure 1:
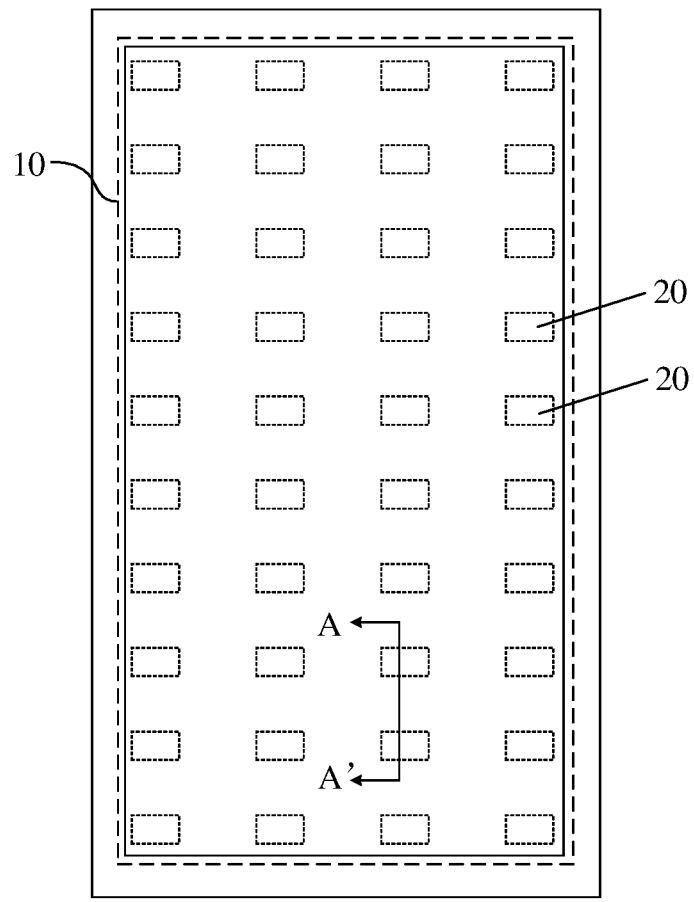
FIG. 1 is a structural schematic diagram of a partial area of an organic light-emitting display panel according to an embodiment of the present disclosure.
Figure 2:
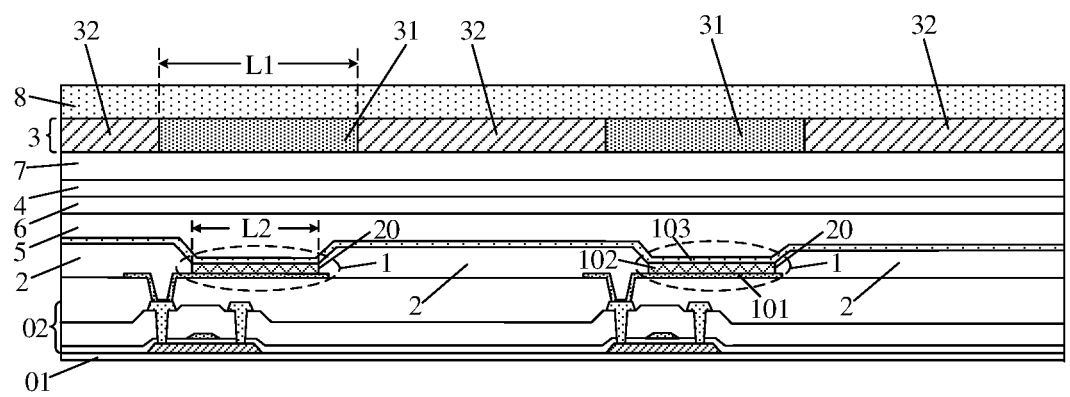
FIG. 2 is a sectional view along a direction AA' in FIG. 1.

FIG. 1 is a structural schematic diagram of a partial area of an organic light-emitting display panel according to an embodiment of the present disclosure, and FIG. 2 is a sectional view along a direction AA' in FIG. 1. As shown in FIGS. 1 and 2, an organic light-emitting display panel provided by an embodiment of the present disclosure includes a display area 10, an organic light-emitting component 1, a pixel defining layer 2, a color resist layer 3. The organic light-emitting component 1 is located in the display area 10. The pixel defining layer 2 is located in the display area, and includes an aperture region 20 defining the organic light-emitting component 1. The color resist layer 3 is located at a light-emitting side of the light-emitting component 1, and includes a color resist 31 corresponding to the aperture region 20 and a black resist 32 located outside the color resist 31 in the display area. The color of the color resist 31 is same as the color of the organic light-emitting component 1 defined by the corresponding aperture region 20.

Figure 3:
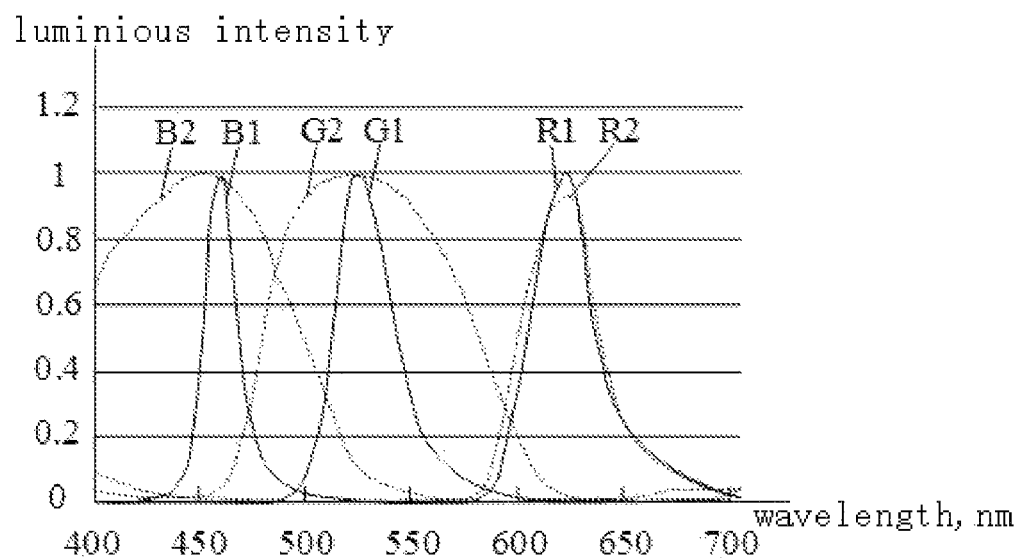
FIG. 3 is a spectrum simulation graph of an organic light-emitting component and a color resist.

The black resist 32 corresponds to a portion outside of the aperture region 20. The black resist 32 can be formed by doping carbon black particles in the resin material, and the carbon black particles can absorb light so as to block the reflected light outside of the aperture region 20. The color resist 31 is located in the corresponding aperture region 20, so that the light of the organic light-emitting component 1 can be normally emitted, thereby achieving a function of image display. FIG. 3 is a spectrum simulation graph of an organic light-emitting component and a color resist, where the abscissa indicates wavelength, the ordinate indicates luminous intensity, R1 represents a curve of a red resist, R2 represents a curve of a red organic light-emitting component, G1 represents a curve of a green resist, G2 represents a curve of a green organic light-emitting component, B1 represents a curve of a blue resist, and B2 represents a curve of a blue organic light-emitting component. It can be seen from FIG. 3 that peaks of the curves of the color resist and the organic light-emitting component having a same color are located at similar positions. The results in the following Table 1 can be obtained by a calculation according to FIG. 3.

TABLE 1

|  | red | green | blue |
| --- | --- | --- | --- |
| organic light-emitting component | 0.670, 0.328 | 0.199, 0.737 | 0.142, 0.042 |
| organic light-emitting component and color resist | 0.673, 0.326 | 0.193, 0.742 | 0.142, 0.040 |

Table 1 shows color coordinates of sub-pixels having various colors at the maximum luminous intensity. It can be seen that the color coordinate of the organic light-emitting components without color resist at the maximum luminous intensity and the color coordinates of the organic light-emitting components with color resist at the maximum luminous intensity show no significant difference. It can be seen from FIG. 3 and Table 1 that, no matter whether the organic light-emitting component has a color resist or has no color resist, chrominance of the light does not substantially shifted, the saturation is not lowered, and the influence on the luminescence spectrum of each color is insignificant after providing the color resist layer.

It should be noted that the organic light-emitting component 1 includes an anode 101, an organic light-emitting layer 102, and a cathode 103 sequentially stacked. Each organic light-emitting component 1 has a separate anode 101. The different organic light-emitting components 1 can share one cathode 103 arranged in a whole layer. Under a voltage of the anode 101 and the cathode 103, electrons and holes are recombined in the organic light-emitting layer 102, so that the organic light-emitting layer 102 emits light. The organic light-emitting layer 102 is completely located in the aperture region 20. That is, the position, shape and size of the organic light-emitting layer 102 are defined by the aperture region 20. The organic light-emitting layer 102, its adjacent anode 101 and cathode 103 constitute the organic light-emitting component 1. An underlay substrate 01 is further arranged on a side of the organic light-emitting component 1 facing away from the color resist layer 3. A control layer 02 is arranged between the underlay substrate 01 and the organic light-emitting component 1. The control layer 02 includes a transistor or the like having a film layer structure for controlling the organic light-emitting component 1 to emit light.

In the organic light-emitting display panel according to the embodiment of the present disclosure, since a black resist for absorbing light is arranged in the non-aperture region, the reflection of the ambient light in the non-aperture region is reduced by arranging a color resist layer, without using a polarizer. On the one hand, when the color resist layer is arranged, the influence on the luminescence spectrum of each color is insignificant, and the chrominance will not substantially shift. On the other hand, the material of the color resist layer is made of an organic material, i.e., resin doped with dye, so that the color resist layer has a relatively great Yang modulus, a relatively small thickness (only a few micrometers), and a good bending resistance. On the contrary, the polarizer is composed of a TAC layer, a PVA layer, a TAC layer, a PSA layer and a compensation layer that are stacked. The TAC layer is made of triacetate fiber, the PVA layer is made of polyvinyl alcohol, and the PSA layer is made of acrylate polymer. Each layer has a different Yang modulus, and the overall polarizer is relatively thick (tens of micrometers), and thus has a poor bending resistance. In the embodiments of the disclosure, the polarizer is replaced with the color resist layer, thereby improving the bending resistance of the display panel.

In an embodiment, the color resist 31 includes a red resist, a green resist, and a blue resist. A thickness of the red resist is greater than a thickness of the blue resist, and a thickness of the green resist is greater than the thickness of the blue resist.

Figure 4:
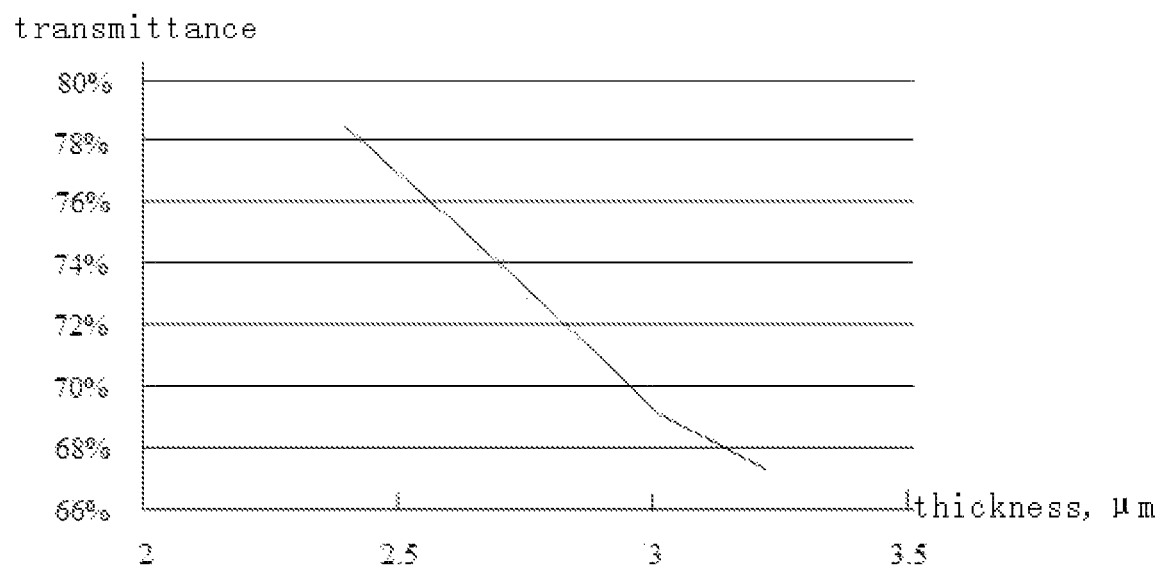
FIG. 4 is a graph showing a relationship between a thickness and a transmittance of a color resist in a simulation test.

FIG. 4 is a graph showing a relationship between a thickness and a transmittance of a color resist in a simulation test, where the abscissa is thickness (μm) of the color resist, and the ordinate is transmittance. It can be seen from FIG. 4 that the thickness of the color resist and the transmittance correlate inversely. The organic light-emitting components having different colors have different service lives. The service life of the blue organic light-emitting component is shorter than the service life of the red organic light-emitting component and the service life of the green organic light-emitting component. Therefore, the thickness of the red resist is set to be greater than the thickness of the blue resist, and the thickness of the green resist is set to be greater than the thickness of the blue resist. In this way, when the different color sub-pixels have a same brightness, the blue organic light-emitting component can be driven with a smaller current value, thereby prolonging the service life of the blue organic light-emitting component, and making the service lives of the organic light-emitting components having different colors to be similar.

In an embodiment, the color resist 31 has a thickness of a, where 1.6 μm<a<3 μm.

On the one hand, in order to increase the brightness of the display panel, the transmittance of the color resist layer 3 should be greater. On the other hand, in order to reduce the reflection of ambient light on the display panel, the reflectivity of the color resist layer 3 should be smaller. Therefore, it is necessary to set the thickness of the color resist layer 3 as small as possible to increase the brightness of the display panel, and it is also necessary to set the thickness of the color resist layer 3 as great as possible to reduce the reflection of ambient light on the display panel. In a simulation test, when the thickness of the color resist layer 3 is increased from 1.6 μm to 2.6 μm, the reflectivity of the color resist layer 3 is decreased from 7.65% to 6.13%. It is estimated that when the thickness of the color resist layer 3 reaches 3 μm, the reflectivity of the color resist layer 3 reaches about 6%. The reflectivity of the color resist layer 3 between 6% and 7.65% can be achieved by controlling the reflectivity of the actual display panel through other means. Meanwhile, when the thickness of the color resist layer 3 is 1.6 μm to 3 μm, the transmittance of the color resist layer 3 can also satisfy the requirements on the brightness of the display panel. Therefore, the thickness of the color resist 31 is set to be 1.6 μm to 3 μm.

In an embodiment, on a plane where the organic light-emitting display panel is located, an area of the color resist 31 is greater than an area of the corresponding aperture region 20.

According to an actual brightness attenuation test, when a brightness at an oblique viewing angle is attenuated to 50% with respect to a brightness at perpendicular viewing angle during a change of viewing angle, in the embodiment of the present disclosure, the oblique viewing angle is 40.8° when the area of the color resist 31 is equal to the area of the corresponding aperture region 20; and the oblique viewing angle is 44.2° when the color resist layer is replaced with the polarizer. When a brightness at an oblique viewing angle is attenuated to 10% with respect to a brightness at perpendicular viewing angle during the change of viewing angle, in the embodiments of the present disclosure, the oblique viewing angle is 69.7° when the area of the color resist 31 is equal to the area of the corresponding aperture region 20; and the oblique viewing angle is 75.5° when the color resist layer is replaced with the polarizer. It can be seen that the viewing angle become smaller by introducing the color resist layer when compared with using the polarizer. Therefore, the viewing angle can be increased while the brightness of the display panel can be improved by setting the area of the color resist 31 to be greater than the area of the corresponding aperture region 20.

In an embodiment, on the plane at which the organic light-emitting display panel is located, a length L1 of any side of the color resist is b times a length of a corresponding side of the corresponding aperture region, where $1 < b \leq 1.3$.

The color resist 31 has the same shape as the corresponding aperture region 20. The center points of the color resist 31 and the corresponding aperture region 20 coincide in a direction perpendicular to the display panel, and each side of the color resist 31 and each side of the aperture regions 20 are parallel to each other, respectively. For example, the color resist 31 has a shape of rectangle including two long sides and two short sides, and the aperture region 20 has also a shape of rectangle including two long sides and two short sides. The long sides of the color resist 31 are parallel to the long sides of the aperture region 20, and the short sides of the color resist 31 are parallel to the short sides of the aperture region 20. The length of the long side of the color resist 31 is 1.2 times the length of the long side of the aperture region 20, and the short side of the color resist 31 is 1.2 times the length of the short side of the aperture region 20.

TABLE 2

|  | b = 1 | b = 1.1 | b = 1.2 | b = 1.3 |
|---|---|---|---|---|
| attenuated to 50% with respect to the brightness of relative to the perpendicular viewing angle | 40.8° | 41.9° | 42.6° | 43.9° |
| attenuated to 10% with respect to the brightness of relative to the perpendicular viewing angle | 69.7° | 71.3° | 72.5° | 74.2° |

Table 2 shows the oblique viewing angles corresponding to the relative brightness at different length ratios of sides of the color resist 31 and the aperture region 20. For example, 40.8° represents the oblique viewing angle when the brightness is attenuated to 50% with respect to the brightness of relative to the perpendicular viewing angle when the length of any side of the color resist 31 is 1 time the length of a corresponding side of the corresponding aperture region 20. According to the above Table, the larger the value of b is, that is, the larger the area of the color resist 31 relative to the aperture region 20 is, the greater the viewing angle is. When b=1.3, the viewing angle is comparable to the viewing angle of the display panel when the polarizer is used. Therefore, in the embodiments of the present disclosure, b satisfies: $1 < b \leq 1.3$.

In an embodiment, the above organic light-emitting display panel further includes: a transmissive film 4 located between a plurality of organic light-emitting components 1 and the color resist layer 3.

The larger the area of the color resist 31 relative to the aperture region 20 is, the larger the viewing angle is. However, since the area of the black resist 32 is inevitably reduced by increasing the area of the color resist 31, and the black resist 32 has a function of sheltering the reflected light, the reflectivity of the display panel can be improved by increasing the area of the color resist 31. According to a simulation test, when b=1, the reflectivity is 6.13%; when b=1.1, the reflectivity is 7.54%; when b=1.2, the reflectivity is 8.55%; and when b=1.3, the reflectivity is 10.06%. In summary, in order to reduce the reflectivity of the display panel in the case of increasing the viewing angle, the transmissive film 4 between the organic light-emitting component 1 and the color resist layer 3 can reduce the reflectivity of the display panel by reducing the transmittance of the display panel.

In an embodiment, the transmissive film 4 has a transmittance of c, where $50\% \leq c \leq 70\%$.

TABLE 3

|  | b = 1, without transmissive film | b = 1.2, 70% transmissive film | b = 1.2, 60% transmissive film |
|---|---|---|---|
| transmittance | 75.4% | 52.8% | 45.2% |
| reflectivity | 6.13% | 5.97% | 5.32% |

Table 3 indicates a relationship between the transmittance and the reflectivity of the display panel when providing transmissive films with different transmittance and different values of b. According to a simulation test, b is required to be greater than 1, and the requirement on the display panel can be met by selecting the transmissive film 4 having a transmittance of 50% to 70%.

In an embodiment, the material of the transmissive film 4 is a fluorine resin, an epoxy resin or glass fiber non-woven fabric.

Figure 5:
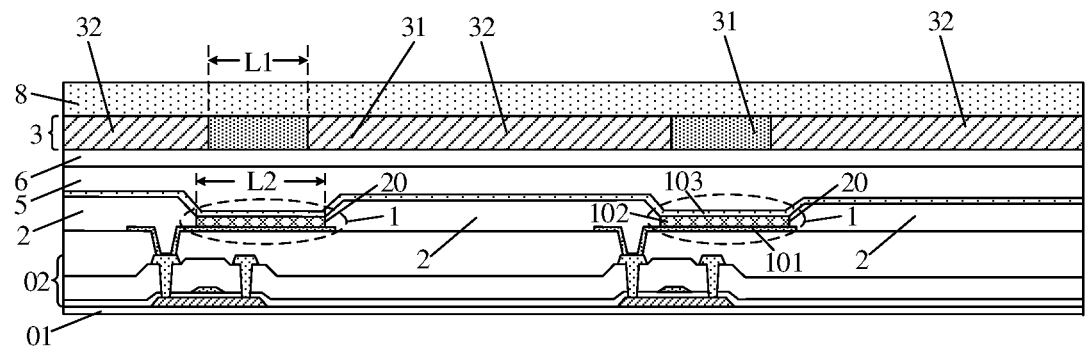
FIG. 5 is another sectional view along the direction AA' in FIG. 1.

FIG. 5 is another sectional view along the direction AA' in FIG. 1. Optionally, as shown in FIG. 5, on the plane at which the organic light-emitting display panel is located, the area of the color resist 31 is smaller than the area of the corresponding aperture region 20.

For a display panel for a particular application, if the viewing angle is not required to be considered, the area of the color resist 31 can set to be smaller than the area of the corresponding aperture region 20, thereby the reflectivity of the display panel can be effectively reduced.

In an embodiment, on the plane where the organic light-emitting display panel is located, the length L1 of any side of the color resist 31 is d times the length L2 of the corresponding side of the corresponding aperture region 20, where $0.5<d<0.7$.

According to a simulation test, when $d=1$, the reflectivity of the display panel is 6.13%; when $d=0.7$, the reflectivity of the display panel is 5.41%, and when $d=0.5$, the reflectivity of the display panel is 4.93%. By satisfying $0.5<d<0.7$ without considering the viewing angle, the reflectivity of the display panel can be reduced to meet the requirements, the difference between the area of the color resist 31 and the area of the aperture region 20 will not be excessively large, thereby avoiding a low brightness of the display panel.

In an embodiment, the organic light-emitting display panel further includes: a thin film encapsulation layer 5 located between the pixel defining layer 2 and the color resist layer 3, and an adhesive layer 6 located between the thin film encapsulation layer 5 and the color resist layer 3.

The thin film encapsulation layer 5 is configured to protect the light-emitting component and other film layers from being eroded by external water and oxygen. The adhesive layer 6 is configured to achieve an adhesion between the color resist layer 3 and the thin film encapsulation layer 5. For example, in the structure as shown in FIG. 2, the transmissive film 4 is arranged between the adhesive layer 6 and the color resist layer 3. In other embodiments, the transmissive film 4 can also be arranged at other positions.

In an embodiment, the adhesive layer 6 is a pressure-sensitive adhesive.

The pressure-sensitive adhesive is a type of adhesive having sensitivity to pressure. In the display panel, the thin film encapsulation layer 5 and its film layer on a side away from the color resist layer are separately formed, and the color resist layer 3 is separately formed. In order to facilitate adhering the color resist layer 3 to the thin film encapsulation layer 5, a pressure sensitive adhesive is arranged between the color resist layer 3 and the thin film encapsulation layer 5, so that the two structures separately formed are adhered together by pressure, thereby improving the bonding force therebetween.

In an embodiment, a planarization layer 7 is located between the adhesive layer 6 and the color resist layer 3.

The color resist layer 3 is formed on a side of the underlay substrate away from the thin film encapsulation layer 5. The color resist layer 3 includes a black resist 32 and a color resist 31 having different colors, the black resist 32 and the color resist 31 being formed separately. The thickness of different color resists may be different. Therefore, the planarization layer 7 formed between the color resist layer 3 and the adhesive layer 6 can adhere the adhesive layer 6 to a flat surface so as to enhance the bonding force between the planarization layer 7 and the thin film encapsulation layer 5 through the adhesive layer 6.

Figure 6:
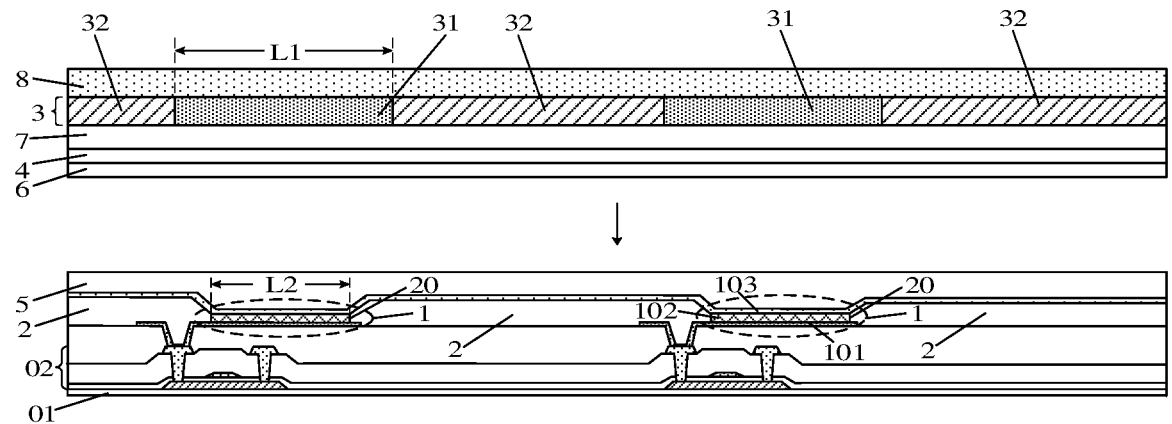
FIG. 6 is a schematic diagram showing an adhered state of the organic light-emitting display panel in FIG. 2.
Figure 7:
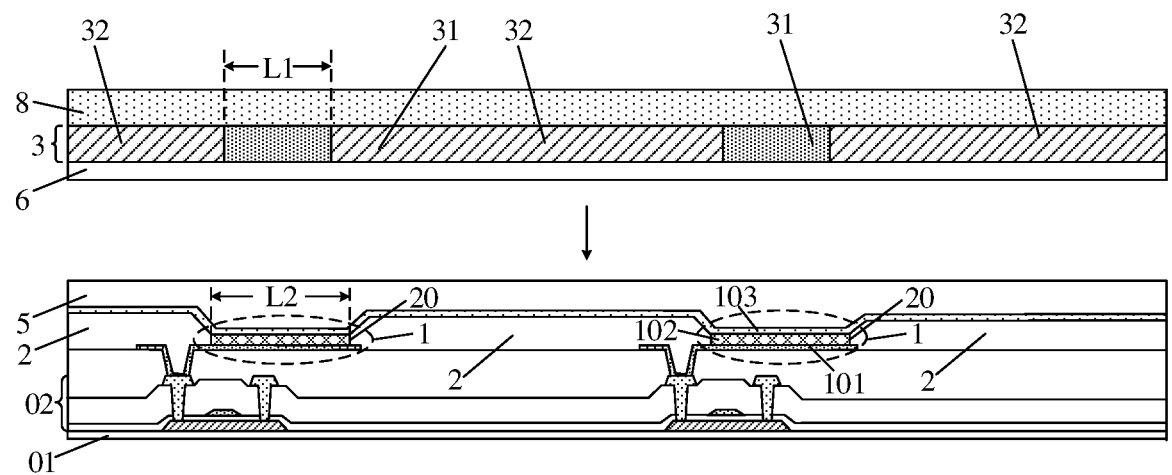
FIG. 7 is a schematic diagram showing an adhered state of the organic light-emitting display panel in FIG. 5.

FIG. 6 is a schematic diagram showing an adhered state of the organic light-emitting display panel in FIG. 2. FIG. 7 is a schematic diagram showing an adhered state of the organic light-emitting display panel in FIG. 5. In an embodiment, as shown in FIG. 2 and FIGS. 5-7, the above organic light-emitting display panel further includes a flexible substrate 8 located on a side of the color resist layer 3 facing away from the thin film encapsulation layer 5. Instead of directly forming the color resist layer 3 on the thin film encapsulation layer 5, the color resist layer 3 is formed on the flexible substrate 8, and then the prepared resist layer 3 together with the flexible substrate 8 are adhered to the thin film encapsulation layer 5. On the one hand, since the process temperature for forming the color resist layer 3 is relatively high, the separate forming can avoid adverse effects on the thin film encapsulation layer 5 during the process. On the other hand, the flexible substrate 8 has a good bending performance, which is suitable for forming a flexible display panel.

In an embodiment, the organic light-emitting component 1 is made of a light-emitting material, and the light-emitting material is one of a red light-emitting material, a green light-emitting material, a blue light-emitting material, and a yellow light-emitting material.

The organic light-emitting component 1 can include an anode 101, an organic light-emitting layer 102, and a cathode 103 that are sequentially arranged. The organic light-emitting layer 102 includes an organic emission layer, and can further include at least one layer selected from a group of consisting of a hole injection layer, a hole transmission layer, an electron transmission layer, and an electron injection layer. The light-emitting material is located in the organic emission layer. When a voltage is applied between the anode 101 and the cathode 103, the electrons and holes are recombined in the organic emission layer, and the organic emission layer emits light having a corresponding color.

Figure 8:
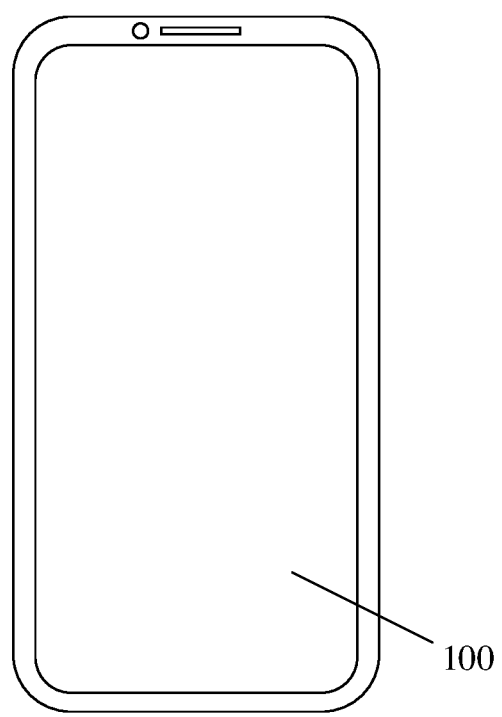
FIG. 8 is a structural schematic diagram of a display device according to an embodiment of the present disclosure.

FIG. 8 is a structural schematic diagram of a display device according to an embodiment of the present disclosure. As shown in FIG. 8, the present disclosure further provides a display device including the above described organic light-emitting display panel 100.

The specific structure and principle of the organic light-emitting display panel 100 are described in the foregoing embodiments, which are not elaborated herein. The display device may be any electronic device having a display function, such as a touch display screen, a mobile phone, a tablet computer, a notebook computer, an electronic paper book, or a television.

In the display device according to the embodiments of the present disclosure, since a black resist for absorbing light is arranged in the non-aperture region, the reflection of the ambient light in the non-aperture region is reduced by arranging a color resist layer without a polarizer. On the one hand, after the color resist layer is arranged, the influence on the luminescence spectrum of each color is insignificant, and the chrominance will not substantially shift. On the other hand, the color resist layer is made of an organic substance, i.e., a resin doped with dye, so that the color resist layer has a relatively great Yang modulus, a relatively small film thickness (only a few micrometers), and a good bending resistance. On the contrary, the polarizer is composed of a TAC layer, a PVA layer, a TAC layer, a PSA layer and a compensation layer that are stacked. The TAC layer is made of triacetate fiber, the PVA layer is made of polyvinyl alcohol, and the PSA layer is made of acrylate polymer. Each layer has different Yang modulus, and the overall polarizer is relatively thick (tens of micrometers), and thus has a poor bending resistance. In the embodiments of the disclosure, the polarizer is replaced with the color resist layer, thereby improving the bending resistance of the display panel.

The above are merely preferred embodiments of the present disclosure, which, as mentioned above, are not intended to limit the present disclosure. Within the principles of the present disclosure, any modification, equivalent substitution, improvement shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. An organic light-emitting display panel, comprising:
    a display area;
    a plurality of organic light-emitting components located in the display area;
    a pixel defining layer located in the display area, wherein the pixel defining layer comprises a plurality of aperture regions, each of the plurality of aperture regions corresponds to one of the plurality of organic light-emitting components; and
    a color resist layer located at a light-emitting side of the plurality of organic light-emitting components, wherein the color resist layer comprises a plurality of color resists corresponding to the plurality of aperture regions and a plurality of black resists located outside the plurality of color resists in the display area, and
    wherein one of the plurality of color resists has a same color as one of the plurality of organic light-emitting components corresponding to one of the plurality of aperture regions,
    on a plane where the organic light-emitting display panel is located, an area of one of the plurality of color resists is smaller than an area of a corresponding one of the plurality of aperture regions, and
    on the plane where the organic light-emitting display panel is located, a length of any side of one of the plurality of color resists is d times a length of a corresponding side of a corresponding one of the plurality of aperture regions, and $0.5<d<0.7$.

2. The organic light-emitting display panel according to claim 1, wherein
    the plurality of color resists comprise a red resist, a green resist, and a blue resist, and
    a thickness of the red resist is greater than a thickness of the blue resist, and a thickness of the green resist is greater than the thickness of the blue resist.

3. The organic light-emitting display panel according to claim 2, wherein
    each of the plurality of color resists has a thickness between 1.6 μm and 3 μm.

4. The organic light-emitting display panel according to claim 1, further comprising:
    a thin film encapsulation layer located between the pixel defining layer and the color resist layer; and
    an adhesive layer located between the thin film encapsulation layer and the color resist layer.

5. The organic light-emitting display panel according to claim 4, wherein
    the adhesive layer comprises a pressure-sensitive adhesive.

6. The organic light-emitting display panel according to claim 4, further comprising:
    a planarization layer located between the adhesive layer and the color resist layer.

7. The organic light-emitting display panel according to claim 4, further comprising:
    a flexible substrate located on a side of the color resist layer facing away from the thin film encapsulation layer.

8. The organic light-emitting display panel according to claim 1, wherein
    the plurality of organic light-emitting components comprises a light-emitting material, and the light-emitting material is a red light-emitting material, a green light-emitting material, a blue light-emitting material, or a yellow light-emitting material.

9. A display device, comprising the organic light-emitting display panel according to claim 1.

* * * * *